United States Patent
Takahashi et al.

(10) Patent No.: US 8,352,219 B2
(45) Date of Patent: Jan. 8, 2013

(54) NUMERICAL STRUCTURE-ANALYSIS CALCULATION SYSTEM

(75) Inventors: Kunihiro Takahashi, Yokohama (JP);
Toshiaki Sakurai, Yokohama (JP);
Tatsuya Nakada, Yokohama (JP);
Kengo Inoue, Yokohama (JP)

(73) Assignee: Keio University, Tokyo (JP)

( * ) Notice: Subject to any disclaimer, the term of this patent is extended or adjusted under 35 U.S.C. 154(b) by 579 days.

(21) Appl. No.: 12/528,792

(22) PCT Filed: Feb. 4, 2008

(86) PCT No.: PCT/JP2008/051729
§ 371 (c)(1),
(2), (4) Date: Aug. 26, 2009

(87) PCT Pub. No.: WO2008/105221
PCT Pub. Date: Sep. 4, 2008

(65) Prior Publication Data
US 2010/0100361 A1    Apr. 22, 2010

(30) Foreign Application Priority Data

Feb. 28, 2007   (JP) ................................ 2007-049275

(51) Int. Cl.
*G06F 17/50*  (2006.01)
*G06F 7/60*  (2006.01)
*G06F 17/10*  (2006.01)
*G06G 7/48*  (2006.01)

(52) U.S. Cl. .................... 703/1; 703/2; 703/6; 703/7
(58) Field of Classification Search ............... 703/1, 2, 703/6, 7
See application file for complete search history.

(56) References Cited

U.S. PATENT DOCUMENTS

| | | | | |
|---|---|---|---|---|
| 6,101,450 | A * | 8/2000 | Dasgupta ........................ 702/42 |
| 6,781,702 | B2 * | 8/2004 | Giannakopoulos et al. .. 356/601 |
| 6,876,956 | B1 * | 4/2005 | Cirak et al. ...................... 703/2 |
| 7,027,048 | B2 * | 4/2006 | Brombolich ................. 345/420 |
| 7,308,387 | B1 * | 12/2007 | Feng et al. ........................ 703/1 |
| 7,321,365 | B2 * | 1/2008 | Brombolich ................. 345/420 |
| 7,337,077 | B2 * | 2/2008 | Sugioka .......................... 702/50 |
| 7,392,163 | B1 * | 6/2008 | Bindeman ........................ 703/2 |

(Continued)

OTHER PUBLICATIONS

Roylance, David. "Trusses", Jun. 2000.*

(Continued)

*Primary Examiner* — Shambhavi Patel
(74) *Attorney, Agent, or Firm* — patenttm.us

(57) ABSTRACT

The object is to enable the calculation of load transfer paths in case of distributed load applied to the structure with the numerical structure-analysis calculation system. The value of the parameter U at each point is calculated according to the ratio of the complementary strain energy U at the application of load without fixing the point in the structure and the complementary strain energy U' at the application of load with fixing one point in the structure. In the actual calculation, according to the complementary strain energy U, and the flexibility matrix $C_{AC}$ with respect to the loading point A and one point C in the structure, and the inverse matrix $C_{CC}^{-1}$ of the flexibility matrix with respect to point C, and the load $p_A$ at the loading point A, the value of the parameter U ($C_{AC} \cdot C_{CC}^{-1} C_{CA} p_A \cdot p_A / (2U)$) at point C is calculated. Or, from the complementary strain energy U, and the inverse matrix $C_{CC}^{-1}$, and the displacement $d_C$ at point C, the value of the parameter U**($d_C \cdot C_{CC}^{-1} d_C / (2U)$) at point C is calculated.

15 Claims, 5 Drawing Sheets

U.S. PATENT DOCUMENTS

| | | | |
|---|---|---|---|
| RE41,398 E * | 6/2010 | May et al. | 73/10 |
| 2004/0194051 A1* | 9/2004 | Croft | 716/20 |
| 2005/0032029 A1* | 2/2005 | Trunk | 434/300 |
| 2005/0076596 A1* | 4/2005 | Igarashi | 52/514 |

OTHER PUBLICATIONS

Gea et al. "Topology Optimization of Structures with Geometrical Nonlinearities", Computers and Structures, 79 (2001).*

Saouma, Victor. "Finite Element II—Solid Mechanics", 2004.*

Kemmler et al. "Large deformations and stability in topology optimization", Struct Multidisc Optim (2005) 30: 459-476.*

Toshiaki Sakurai et al., "Kozobutsu no Kaju Keiro U *Kaiseki ni Okeru Taten Fuka Joken no Koryo", Transactions of the Japan Society of Mechanical Engineers (A hen), Feb. 25, 2007, vol. 73, No. 726, pp. 195 to 200.

* cited by examiner

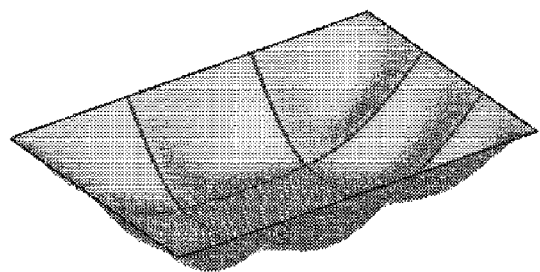
FIG. 3(a) Grid Plate Model receiving equally distributed load
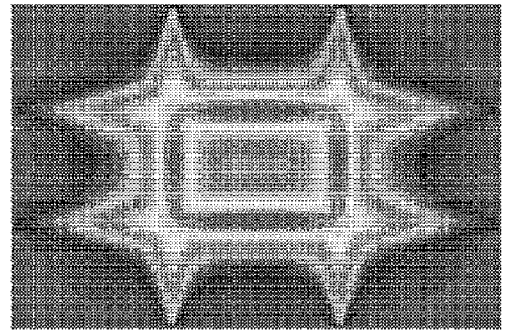
U Distribution  0 ◄—U—► 0.8
FIG. 3(b)
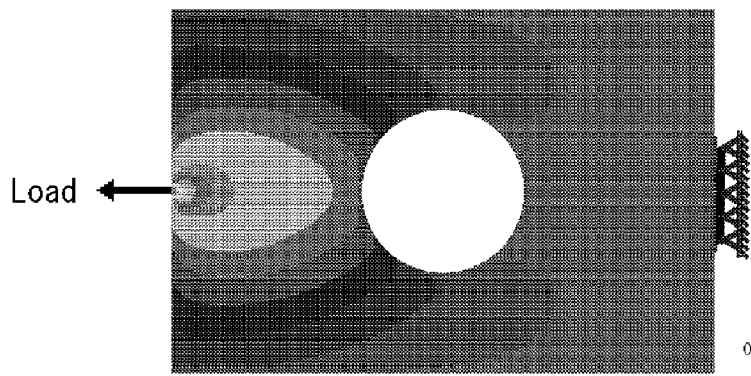
FIG. 3(c) U** Distribution on the plate with circular hole
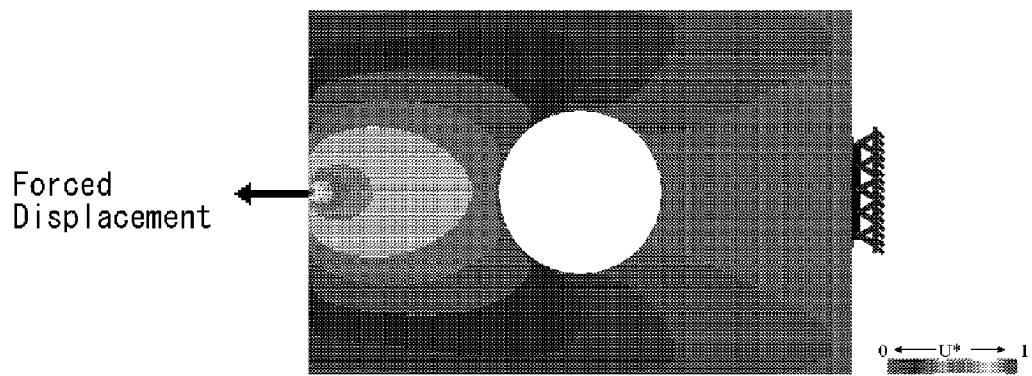
FIG. 3(d) U* Distribution on the plate with circular hole

NUMERICAL STRUCTURE-ANALYSIS CALCULATION SYSTEM

FIELD OF THE INVENTION

The present invention relates to a numerical structure-analysis calculation system, especially to a numerical structure-analysis calculation system to perform the structural analysis with utilizing FEM (Finite Element Method) based upon the flexibility matrix by means of calculation of the parameter U** indicating the load transfer.

BACKGROUND ART OF THE INVENTION

In general, stress distribution is utilized to discuss the behavior of the load transfer in the structural object. However, a stress-concentrated point is not always the transfer point of force. The point that stress is concentrated locally is sometimes connected weakly with the loading point. Therefore, the connective stiffness in relation to the loading point cannot be obtained from the stress concentration. Then, the present inventors proposed the new parameter U* able to indicate clearly the force transfer in the patent document 1 and the non-patent documents from 1 to 9. The parameter U* is the parameter to show the connective stiffness in relation to the loading point with respect to arbitrary point in the structural object and to indicate the behavior of the load transfer.

The parameter U* is calculated based on the concept of "displacement method." One point in the structure is fixed and the displacement is given to the loading point. And then, the value of the parameter U* can be calculated. The force flow or the load transfer can be naturally represented with the stiffness from the loading point. The structure is designed from this viewpoint. The parameter U* represented with the stiffness matrix can be rather grasped intuitionally than the stress distribution. The design method utilizing the parameter U* is employed actually in the automobile manufacturers. The problems of the chassis and body are found by examining the load transfer path and then the reinforcement of stiffness is considered. It is confirmed that the parameter U* is very useful in this field. For the detail of the parameter U*, the patent document 1 and the non-patent documents from 1 to 9 can be referred to as shown in the following with their abstracts.

The numerical structure analysis system as disclosed in the patent document 1 is the system able to reduce the calculation time based on load transfer method. The parameters are set in the condition that the supporting point B in the objective structure is fixed and the load is applied to the specific loading point A. The FEM calculation means calculates the deformation of the objective structure according to the total stiffness matrix in the stiffness matrix holding means to find the basic data such as the displacement of each point and so on. The FEM calculation means calculates each deformation to find the displacement under the condition that the specific loading point A and the supporting point B are fixed and three inspection loadings are applied to the variable loading point C. The partial stiffness matrix calculation means solves the multidimensional simultaneous linear equation based upon the inner stiffness matrix of the objective structure, the load value and the displacement to find the partial stiffness matrix $K_{AC}$. The stiffness parameter calculation means calculates the value of the stiffness parameter U* according to the partial stiffness matrix $K_{AC}$ and the displacement in the basic data and so on. The value of U* of each point is calculated while changing the variable loading point C so that all the necessary points in the objective structure may be followed sequentially.

In the non-patent document 1, conditions for desirable structures based on a concept of load transfer courses is reported. A new concept of a parameter E is introduced to express load transfer courses for a whole structure. A degree of connection between a loading point and an internal arbitrary point in the structure can be quantitatively expressed with the parameter E. Based on the proposed concept, three conditions for desirable structures are introduced: (1) Continuity of E, (2) Linearity of E, (3) Consistency of courses. After introducing these three conditions as objective functions, structural optimization with numerical computation is carried out. Despite the fact that no concept of stresses or strains is introduced, the obtained structure has a reasonable shape. Finally, the load transfer courses for a simple structure are experimentally measured and these values demonstrate that the parameter E can effectively be used.

In the non-patent document 2, vibration reduction for cabins of heavy-duty trucks with a concept of load path is reported. The load transfer paths in the cabin structures of heavy-duty trucks are investigated under static loading and the results are applied to the vibration reduction of cabins. In a preliminary simulation using a simple model, it is shown that the floor panel vibration is closely related to the stiffness of the front cross-member of the floor structure. Load path analyses using the finite element method show that the load paths have some discontinuities and non-uniformities in the front cross-member which cause the low stiffness of the member.

In the non-patent document 3, application of ADAMS for vibration analysis and structure evaluation by NASTRAN for cab floor of heavy-duty truck is reported. The load transfer paths in the cabin structures of heavy-duty trucks are investigated under static loading, and the results are applied to the reduction of vibration in cabins. In a preliminary simulation using a simple model with ADAMS/Vibration, it is shown that vibration in the floor panel is closely related to the stiffness of the front cross-member of the floor structure. Load path analyses using the finite element method with NASTRAN show that the load paths have some discontinuities and non-uniformities in the front cross-member, reducing that member's stiffness.

In the non-patent document 4, ADAMS application for the floor vibration in the cabin of heavy-duty trucks and U* analysis of the load path by NASTRAN is reported. Realization of lightweight and cost-effective structures of heavy-duty trucks is an important aspect of structural designs, and numerical analyses have played a key role in this regard. In a preliminary simulation using ADAMS/Vibration, it is shown that the floor panel vibration is closely related to the stiffness of the front cross-member. Load path analyses using MSC/NASTRAN show that the load transfer paths have some discontinuities and non-uniformities in the front cross-member.

In the non-patent document 5, expression of load transfer paths in structural analysis and its applications is reported. A new parameter U* is introduced to express the load transfer path using FEM. As an example, load path U* analysis is applied to a plate structure with a circular hole. Although the effect of stress concentration suggests strong force transfer at the corner of the hole, the obtained position of the load transfer path avoids a corner of the hole. This result coincides with their intuitive prediction. Moreover, they try to extend the calculation method of U* analysis to a structure with more complex boundary conditions. The effectiveness of the introduced method is verified using the FEM model of an actual heavy-duty truck cab.

In the non-patent document 6, load path optimization and U* structural analysis for passenger car compartments under frontal collision is reported. A new concept, a parameter U*, is introduced to express load transfer in a structure. Two cases of U* analysis for a floor structure of a passenger compartment are examined. In the first case, three conditions of U* are introduced as objective functions, and GA (Genetic Algorithm) structural optimization is applied. The emergent floor structure after the GA calculation has a unique shape in which a member connects the frontal part of an under-floor member and the rear part of a side-sill. In the second case, the U* values and the load paths in a floor structure under collision are calculated by use of PAM-CRASH. As the collision progresses, the under-floor member becomes the principal load path, and in the final stage of the collision the roll of the under-floor member becomes dominant.

In the non-patent document 7, vibration reduction in the cabins of heavy-duty trucks using the theory of load transfer paths is reported. The objective of this study is to investigate the load transfer paths in the cabin structures of heavy-duty trucks under static loading, and to apply the results to reduce vibration in cabins. In a preliminary simulation using a simple model, it is shown that the floor panel vibration is closely related to the stiffness of the front cross-member of the floor structure. Load path U* analyses using the finite element method show that the low stiffness of the front cross-member is caused by discontinuities and non-uniformities in the load paths.

In the non-patent document 8, expression of load transfer paths in structures is reported. A concept of a parameter U* has been introduced by the authors to express load transfer paths in a structure. In this paper, matrix formulation of internal stiffness shows that the value of U* expresses a degree of connection between a loading point and an internal arbitrary point. Stiffness fields, stiffness lines, and stiffness decay vectors are defined using newly introduced U* potential lines. A concept of a load path can be expressed as a stiffness line that has a minimum stiffness decay vector. A simple model structure is calculated using FEM for an application of U* analysis. The distribution of U* values shows that a diagonal member between a loading point and a supporting point plays an important role for the load transfer.

In the non-patent document 9, experimental study of U* analysis in load transfer using the actual heavy-duty truck cabin structure and scaled model is reported. The distribution of U* is known to indicate the load transfer path in the structure. Two experimental measuring method of U* is developed of U* with respect to the actual heavy-duty truck cabin structure and the scaled plastic model. In these methods, different from the conventional method, the stiffness data of each member is not necessary. In FEM, the effect of the actual plate to play the important role in U* analysis cannot be expressed. By using the plastic scaled model, the strengthening effect can be directly measured according to the distribution of U* value.

Patent document 1: JP2005-321695(Application Specification)

Non-patent document 1: Kunihiro Takahashi; Conditions for desirable structures based on a concept of load transfer courses, International Structural Engineering and Construction Conference (ISEC-1) Honolulu, Proc. ISEC-01, pp. 699-702, 2001.

Non-patent document 2: Toshiaki Sakurai, Hiroaki Hoshino, Kunihiro Takahashi; Vibration Reduction for Cabins of Heavy-Duty Trucks with a Concept of Load Path, Proc. JSAE No. 36-02, pp. 5-8, 2002 (in Japanese with English summary).

Non-patent document 3: Hiroaki Hoshino, Toshiaki Sakurai, Kunihiro Takahashi: Application of ADAMS for Vibration Analysis and Structure Evaluation By NASTRAN for Cab Floor of Heavy-Duty Truck, The 1st MSC.ADAMS European User Conference, London, November, 2002.

Non-patent document 4: Toshiaki Sakurai, Hiroaki Hoshino, Masatoshi Abe, Kunihiro Takahashi; ADAMS Application for the Floor Vibration in the Cabin of Heavy-duty Trucks and U* Analysis of the Load Path by NASTRAN, (MSC.ADAMS User Conference 2002).

Non-patent document 5: Toshiaki Sakurai, Masatoshi Abe, Soei Okina, Kunihiro Takahashi; Expression of Load Transfer Paths in Structural Analysis and its Applications, Trans. JSCES, Vol. 8, pp. 401-404, May 2003.

Non-patent document 6: Toshiaki Sakurai, Junichi Tanaka, Akinori Otani, Changjun Zhang, Kunihiro Takahashi; Load Path Optimization and U* Structural Analysis for Passenger Car Compartments under Frontal Collision, International Body Engineering Conference 2003, pp. 181-186, JSAE 20037007, SAE 2003-01-2734, 2003.

Non-patent document 7: Hiroaki Hoshino, Toshiaki Sakurai, Kunihiro Takahashi: Vibration reduction in the cabins of heavy-duty trucks using the theory of load transfer paths, JSAE Review 24(2003) 165-171.

Non-patent document 8: Kunihiro Takahashi, Toshiaki Sakurai: Expression of Load Transfer Paths in Structures, J. JSME, (A)71-708 (2005), pp. 1097-1102.

Non-patent document 9: Kengo Inoue, Yuichiro Ichiki, Ikuma Matsuda, Toshiaki Sakurai, Hideaki Ishii, Tetsuo Nohara, Hiroaki Hoshino, Kunihiro Takahashi: Experimental study of U* analysis in load transfer using the actual heavy-duty truck cabin structure and scaled model, Proc. JSAE, No. 90-04, pp. 27-30, 2004.

DISCLOSURE OF THE INVENTION

Problem to be Solved by the Invention

However, there are following problems in the conventional calculating method using the parameter U. When the load is distributed, the fixed point must be displaced as much as the determined value in the calculation of U*. Here, the determined value means the distribution of displacement when one point is fixed. In the case of distributed load, the U* method is not applicable because of self-contradiction that the fixed loading point is displaced. Even though it is tried to apply formally, the strain energy stored in whole system becomes infinity if the loading point is fixed. Then, the value of the parameter U* at every loading point becomes 1 and no meaningful result can be obtained. Consequently, it is impossible to treat the problems on vibration and collision.

The object of this invention is, solving the above problem, to enable the calculation of load transfer path in case of distributed load using the parameter U** based on the stress method with the contrary concept of the displacement method.

Means to Solve the Problem

In order to solve the above problem, in this invention, a numerical structure-analysis calculation system to perform structural analysis of objective structure for analysis based on the load-transfer-path method furnished with an FEM calculation means to calculate deformation of objective structure for analysis is constructed as follows. A first calculation means to calculate the complementary strain energy U under the condition that the loading point is loaded without fixing any points in the structure. A second calculation means to calculate the complementary strain energy U' under the condition that the loading point is loaded with fixing one point in the structure. And a third calculation means to calculate the value $U^{**}=(1-(U'/U))$ according to each complementary strain energy value at each point.

It also comprises the followings. A first calculation means to calculate the complementary strain energy U under the condition that the loading point A is loaded with load $p_A$ without fixing any points in the structure. A second calculation means to calculate the flexibility matrix $C_{AC}$ in accordance with both of the loading point A and one point C in the structure. A third calculation means to calculate the inverse matrix $C_{CC}^{-1}$ of the flexibility matrix $C_{CC}$ in accordance with one point C in the structure. And a fourth calculation means to calculate the value of the parameter $U^{**}=(p_A \cdot C_{AC} C_{CC}^{-1} C_{CA} p_A/(2U))$ at each point C from the values of $C_{AC}$, $C_{CC}^{-1}$, $p_A$ and U.

Or it also comprises the followings. A first calculation means to calculate the complementary strain energy U under the condition that the loading point is loaded with load $p_A$ without fixing any points in the structure. A memory means to hold the value of the displacement of each point under the condition that the loading point is loaded with $p_A$ without fixing any points in the structure. A second calculation means to calculate the inverse matrix $C_{CC}^{-1}$ of the flexibility matrix $C_{CC}$ in accordance with one point C in the structure. And a third calculation means to calculate the value of the parameter $U^{**}=(d_C \cdot C_{CC}^{-1} d_C/(2U))$ at each point C from the values of the displacement $d_C$ at the point C, and the inverse matrix $C_{CC}^{-1}$, and U.

Or it also comprises the followings. A first calculation means to calculate the complementary strain energy U under the condition that the distributed load is applied without fixing any points in the structure, a memory means to hold the value of the displacement of each point under the condition that the distributed load is applied without fixing any points in the structure. A second calculation means to calculate the inverse matrix $C_{CC}^{-1}$ of the flexibility matrix $C_{CC}$ in accordance with one point C in the structure. And a third calculation means to calculate the value of the parameter $U^{**}=(d_C \cdot C_{CC}^{-1} d_C/(2U))$ at each point C from the values of the displacement $d_C$ at point C, and the inverse matrix $C_{CC}^{-1}$, and U.

Advantages of the Invention

According to the above construction, the load transfer under the condition of distributed load in the vibration or collision problem can be represented. And also, it can be applied to the method to change the load condition by removing the plastic portions.

The most preferable embodiment of the invention

Hereinafter, referring to FIGS. 1-5, the most preferable embodiments of the invention are explained particularly.

EMBODIMENT 1

The first embodiment of this invention is the numerical structure-analysis calculation system constructed as follows. No points in the structure are fixed and the load is applied to the loading point to calculate the complementary strain energy. One point in the structure is fixed and the load is applied to the loading point to calculate the complementary strain energy. The ratio of the latter complementary strain energy to the former is calculated. The value of the parameter $U^{**}$ at each point is calculated according to the value of each ratio.

FIG. 1 is the conceptual drawing and the processing flowchart of the numerical structure-analysis calculation system of the first embodiment of this invention. In FIG. 1, shaping and elastic data 1 is the data about the shape and elasticity of the objective structure for analysis. An FEM calculation means 2 is the means to calculate the deformation of the objective structure for analysis by the finite element method. Fix-point changing means 3 is the means to set the calculation parameters so as to apply the predetermined load to the loading point A, to fix the supporting point B, to follow sequentially all the necessary points in the objective structure for analysis and to change the fixed point C. The energy calculation means 4 is the means to calculate the complementary strain energy according to the load and the displacement at the loading point A.

The parameter calculation means 5 is the means to calculate the parameter $U^{**}$ to indicate the connective strength between the loading point A and the fixed point C according to the complementary energy U when the load is applied to the loading point without fixing any point in the structure and the complementary energy U' when the load is applied to the loading point with fixing one point in the structure. The loading point A is the point to be applied with the load for examining the load transfer path in the objective structure for analysis. The supporting point B is the base point to support the objective structure for analysis at loading. The fixed point C is the point to be selected to follow sequentially all the necessary points of the objective structure for analysis. All the necessary points mean all the points selected as necessary for the analysis aim among the node points of FEM.

The function and operation of the numerical structure-analysis calculation system of the first embodiment of this invention as structured above is explained. First, the concept of the parameter $U^{}$ is explained. As shown in FIGS. 1(a) and (b), the value of the parameter $U^{}$ at each point C is calculated for the arbitrary point C in the structure using the ratio of the value of complementary energy with fixing the point C to the value without fixing. In the calculation exactly according to the definition, the same load is applied to the loading point A both when point C is fixed and when it is not fixed to calculate the ratio of the values of the necessary complementary strain energy at each fixing condition.

The energy used in the conventional parameter $U^*$ and the complementary energy used in the parameter $U^{**}$ is the same value under the linear condition. These may be considered to be the same quantity but they are entirely different. In the non-linear analysis, the difference is obvious. Both of the parameter $U^*$ and the parameter $U^{**}$ are used only in the linear operation. So, the energy used in the parameter $U^*$ and the energy used in the parameter $U^{**}$ become the values of the same tendency. In mathematical treatment or calculation result, there are many differences as mentioned below.

In the calculation of the parameter $U^*$, the energy is calculated according to the displacement. Therefore, the energy expressed with the product of load and displacement is expressed with the function of displacement. On the other hand, the complementary energy used in the calculation of the parameter $U^{**}$ is expressed with the function of load. Therefore, the works in both calculations are different logically. This variable transform from displacement to load is corresponding to the Legendre transformation as often used in the thermodynamics. That is, temperature and entropy are variables transformed by the Legendre transformation. The displacement in ordinary energy and the load in complementary energy are also the variables transformed by the Legendre transformation.

In the calculation of the conventional parameter U*, the load transfer cannot be expressed because of conflict to displace the fixed point under the distributed load. However, the conflict can be avoided using the parameter U**. Therefore, the load transfer can be expressed under the distributed load. There are several distributed loads such as, for example, wind pressure applied to a board, inertial force arising at vibration or collision by the mass of the structure itself.

Moreover, when a small plastic region exists in the elastic structure, removing that portion, the load transfer path can be calculated by applying stress instead of the portion. In this case, the calculation cannot be performed without the parameter U** because that not displacement but force must be applied in the boundary of the removed region. The application of load but not displacement gives the success of the calculation.

The parameter U** is determined as follows.

$$U^{**}=1-(U'/U) \quad \text{(Definition)}$$

U is the complementary strain energy when the load is applied at the loading point A with fixing only the supporting point B in the objective structure for analysis. U' is the complementary strain energy when the load is applied at the loading point A with fixing both of the supporting point B and the arbitrary point C in the objective structure for analysis.

Point A is supposed as the loading point, point B is supposed as the supporting point, and the arbitrary point is supposed as point C. The complementary work applied to the loading point A in the ordinary analysis is supposed as U. On the other hand, the complementary work is supposed as U' when the same load is applied to the loading point A after constraining the displacement of the arbitrary point C as originally free. The value of the parameter U becomes large as the stiffness of the structural part between point A and point C becomes high. The calculation of the parameter U according exactly to this definition needs the sequence as follows.

Referring to FIG. 1, the processing sequence is explained. The shaping and elastic data 1 of the objective structure for analysis is formerly supplied to the FEM calculation means 2. In the step 1, the supporting point B is fixed and the constant load is applied to point A to calculate the displacement using the FEM calculation means 2. The necessary complementary energy U for the displacement is calculated using the energy calculation means 4. In the step 2, the arbitrary point C is fixed and the constant load is applied to point A to calculate the displacement using the FEM calculation means 4. The necessary complementary energy U' for the displacement is calculated using the energy calculation means 4. In the step 3, the values of the parameters U and U' are substituted to the definition equation to calculate the parameter U with respect to that point using the parameter calculation means 5. In the step 4, point C is changed in position sequentially using the fixing point changing means 3 to repeat this calculation. In this way, the distribution of the parameter U all over the structure can be calculated. In the case of distributed load, the calculations are repeated for plural loading points.

In the first embodiment of this invention as described above, because that the numerical structure-analysis calculation system is constructed as follows, the load transfer path can be calculated in case of distributed load. No points in the structure are fixed and the load is applied to the loading point to calculate the complementary strain energy. One point in the structure is fixed and the load is applied to the loading point to calculate the complementary strain energy. The ratio of the latter complementary strain energy to the former is calculated. The value of the parameter U** at each point is calculated according to the value of each ratio.

EMBODIMENT 2

The second embodiment of this invention is the numerical structure-analysis calculation system as constructed as follows. The complementary strain energy U is calculated with the load $p_A$ at the loading point A without fixing the point in the structure. The flexibility matrix $C_{AC}$ is calculated with respect to the loading point A and one point C in the structure. The inverse matrix $C_{CC}^{-1}$ of the flexibility matrix $C_{AC}$ with respect to one point C in the structure is calculated. The value of the parameter $U^{**}=(p_A \cdot C_{AC} C_{CC}^{-1} C_{CA} p_A/(2U))$ at each point C is calculated from the values of $C_{AC}$, $C_{CC}^{-1}$, $p_A$ and U.

FIG. 2 is the conceptual drawing and the flowchart of processing of the numerical structure-analysis calculation system of the second embodiment of this invention. In FIG. 2, shaping and elastic data 1 is the data about the shape and elasticity of the objective structure for analysis. FEM calculation means 2 is the means to calculate the deformation of the objective structure for analysis by the finite element method. Total stiffness matrix holding means 6 is the means to hold the total stiffness matrix calculated with the FEM calculation means. The load setting means 7 is the means to set the calculation parameters in order to apply the load $p_A$ to the loading point A. The displacement holding means 8 is the means to hold the displacement of each point calculated with the FEM calculation means. The flexibility matrix calculation means 9 is the means to calculate the flexibility matrix $C_{AC}$ and so on. FIG. 3 is the drawing to show the example of calculation.

The operation of the numerical structure-analysis calculation system of the second embodiment of this invention as structured above is explained. In the calculation of the parameter U according to the definition as explained in the first embodiment, the calculation is performed in the way to obtain the ratio of the necessary complimentary energy as the same load is applied to the loading point A when point C is fixed and not fixed. It requires very long time to calculate in the first embodiment. When the calculation is performed with constraining one point in the structure sequentially, at every time, whole calculation must be repeated. At every one calculation, very big simultaneous linear equation must be solved. Therefore, in a big calculation model, it takes a very long time to complete whole calculation. Applying this the actual automobile chassis, the calculation time becomes astronomical huge quantity and it is not practical. For example, in a calculation model of chassis modeling of passenger car, one analysis needs about fifteen minutes. About 250 thousand points of the nodes of FEM model exist. Therefore, it takes more than 60 thousand hours to calculate all the values of the parameter U at whole nodes.

Then, the flexibility matrix necessary for calculating the value of the parameter U is calculated using FEM. By calculating the reactive force when fixing each point, the value of the parameter U can be calculated without constraining each point. In the second embodiment, with applying the inspection loading to each point, the flexibility matrices $C_{AC}$ and $C_{CC}$ and the reactive force $p_C'$ are calculated. Without constraining point C, the value of the parameter U is calculated. In the calculation of the parameter U, the flexibility matrix $C_{AC}$ with respect to points A and C and the reactive force $p_C'$ under the condition of point C fixed are required.

Next, the calculation method is explained. The total stiffness matrix is calculated based on the shaping and elastic data of the objective structure for analysis. The total stiffness matrix is the matrix to calculate the load from the displacement. Giving the condition that the rigid motion with respect to point B is zero and solving the simultaneous linear equation in order to calculate the displacement from the load, the flexibility matrix is obtained. The flexibility matrix with respect to points A and C is shown as follows.

$$d_A = C_{AA} p_A + C_{AC} p_C$$

$$d_C = C_{CA} p_A + C_{CC} p_C$$

$p_A$ is the load vector at point A. $p_C$ is the load vector at point C. $d_A$ is the displacement vector at point A. $d_C$ is the displacement vector at point C. $C_{AA}, C_{AC}, C_{CA}$ and $C_{CC}$ are three times three matrices.

The definition of the parameter U** and the derivation of the equation are as follows.

$$U^{**} = (U - U')/U \quad \text{(Definition)}$$

$$2U = p_A \cdot d_A$$

$$2U' = p_A \cdot d_A'$$

$$d_A = C_{AA} p_A$$

$$d_C = C_{CA} p_A$$

$$d_A' = C_{AA} p_A + C_{AC} p_C' = d_A + C_{AC} p_C'$$

$$d_C' = C_{CA} p_A + C_{CC} p_C' = 0$$

$$p_C' = -C_{CC}^{-1} C_{CA} p_A$$

$$2U' = p_A \cdot d_A' = p_A \cdot (C_{AA} p_A + C_{AC} p_C')$$

$$= p_A \cdot C_{AA} p_A + p_A \cdot C_{AC} p_C'$$

$$= p_A \cdot d_A + p_A \cdot C_{AC} p_C'$$

$$= 2U + p_A \cdot C_{AC} p_C'$$

$$2U - 2U' = -p_A \cdot C_{AC} p_C'$$

$$U^{**} = (2U - 2U')/(2U) = -(C_{AC} p_C' \cdot p_A)/(2U)$$

Here, U is the complementary strain energy with unfixed point C. $p_C'$ and $p_A$ are the loads applied to points C and A with fixed point C. U and $p_A$ have only to be calculated once at the first. In order to calculate the parameter U**, the matrix $C_{AC}$ and the vector $p_C'$ have only to be calculated at each point. The matrix $C_{AC}$ can be calculated easily. It takes a very long time to calculate the vector $p_C'$ at each point.

The calculation of the matrix $C_{AC}$ is explained. The inspection loading is applied to point A. When point C is not fixed, $d_C$ becomes as follows.

$$d_C = C_{CA} p_A$$

When point C is not fixed, applying the arbitrary inspection loading $p_A$ to point A, the calculation for whole structure is performed. According to the result, $d_A$ and $d_C$ for that condition are obtained. The values are substituted to the above equation. As the displacement and the load are vectors, three equations are obtained from this substitution. In the same way, applying another inspection loading to point A, three more equations can be obtained. Because three independent loads can be applied in three-dimensional space, nine independent equations can be obtained in all. As the matrix $C_{CA}$ contains nine components, its unknown components can be obtained from nine independent equations obtained by application of the inspection loadings. The calculation time is very short as it is the calculation of simultaneous linear equation with nine unknowns. Here, if the displacement at each point is previously obtained with applying the inspection loading to the point A, the matrix $C_{CA}$ at each point C can be obtained with static analysis of three times. Moreover, as the matrix $C_{AC}$ is the transpose of the matrix $C_{CA}$, the matrix $C_{AC}$ can be calculated easily.

If $C_{AC}$ is calculated, remaining unknown for calculation of $p_C'$ is only the matrix $C_{CC}$. And moreover, considering of the point to be free, it is $p_A = 0$ in this case, it becomes more simple as expressed as follows.

$$d_C'' = C_{CC} p_C'' (p_C'' = C_{CC}^{-1} d_C'')$$

The inspection loading is applied to the point C with free point A. From the result, $d_C''$ and $p_C''$ are obtained. As the matrix $C_{CC}$ contains nine components, from less than or equal to nine independent equations obtained from application of three inspection loadings, those unknown components can be obtained. In this way, the matrix $C_{CC}$ can be obtained. This operation completes with the application of arbitrary load at each point C. According to the displacement method of finite element method, even if the number of the load conditions is large, the number of solving time of the whole simultaneous equation is enough for only once. Therefore, the calculation time is shortened marvelously.

Referring to FIG. 2, the processing sequence is explained. Data 1 with respect to the shape and elasticity of the objective structure for analysis is previously given to the FEM calculation means 2. In the step 11, with the load setting means 7, fixing the supporting point B, applying the load $p_A$ to the point A, with the FEM calculation means 2, the displacement is calculated. The displacement is held in the displacement holding means 8. The total stiffness matrix is held with the total stiffness matrix holding means 6. The necessary energy U at that time is calculated. In the step 12, with the load setting means 7, applying three inspection loadings to the point A, according to its displacement, with the flexibility matrix calculation means 9, the flexibility matrix $C_{AC}$ is calculated. In the step 13, with the load setting means 7, applying three inspection loadings to the point C, according to its displacement, with the flexibility matrix calculation means 9, the inverse matrix $C_{CC}^{-1}$ of the flexibility matrix $C_{CC}$ is calculated. In the step 14, from U, $p_A$, $C_{AC}$ and $C_{CC}^{-1}$, with the parameter calculation means 5, the parameter U** is calculated. In the step 15, varying sequentially the position of the point C, this calculation is repeated.

Referring to FIG. 3, the example of calculation is explained. The perimeter of the flat panel as shown in FIG. 3(a) composed of board part and grid part (thickness ratio is 1:10) is simply supported. The uniform load is applied to the flat panel. The distribution of the parameter U is shown in FIG. 3(b). And, as for the flat panel structure with a circular hole, the parameter U is calculated. The example of the expression of the feature of the load transfer of it is shown in FIG. 3(c). Applying the load to one point on the leftmost edge, the part as shown with the rightmost black line is supported. The distribution of the parameter U* is shown in FIG. 3(d). The concept of both is different. Both of them can express the load transfer equally. The special concern is the flow of force around the loading point. In the case of single point loading, the parameter U** can be substituted for the parameter U*.

As for the lower structure of a small car chassis, the parameter U is calculated applying the uniform load to the floor. Comparing to the calculation method as the definition with direct constraint of each point, with the method of the second embodiment, the calculation speed is about ten times. Thus, using the parameter U, the load transfer under the condition of distributed load applied to the automobile chassis structure can be expressed. As for the analysis of the whole structure by the parameter U, the calculation time and the calculation cost can be reduced to the extent of practical use. Thereby, the parameter U to express the transfer of force can be widely used now. Applying to the vibration problem, a useful result is obtained. It can point out the unexpected structural problems. For example, the rear part of the floor tunnel tends to deform in the direction of back and front. The parameter U** can be calculated without any problems as the predetermined load is applied with one point fixed.

In the parameter U**, based upon the flexibility matrix corresponding to the inverse matrix of the stiffness matrix, the flexibility, the counter concept of the stiffness, is defined. So, it is essentially difficult to understand. But it is more useful than the parameter U*. Under the simple condition such as single point loading but not the condition of distributed load, both of the parameter U* and U** are useful as the same, the parameter U* can be substituted for the parameter U**.

In this example, the flexibility matrix is calculated indirectly. It is easier to calculate if the matrices corresponding to the matrices $C_{AC}$ and $C_{CC}$ can be calculated directly from the total stiffness matrix. The point B is the fixed point. Then, the rows and columns with respect to it can be neglected. Therefore, the matrices are expressed with neglecting the rows and columns with respect to the point B. This process of operation is the ordinary operation in the finite element method. The inverse matrix of the total stiffness matrix is the flexibility matrix in the finite element method. The matrix elements of the total stiffness matrix are already given at the application of the finite element method. The matrix elements of the flexibility matrix of the inverse matrix of it can be obtained from them. They are, that is, also the elements of the flexibility matrix. The characteristic feature of this method is the disuse of the inspection loading. However, in the all-purpose program as Nastran, the inverse matrix does not used directly in the calculation process, so the method cannot be applied to such programs. But in the special FEM programs that use the inverse matrix in the calculation process, it is very useful.

Moreover, if the tendency of deformation between the points A and B can be expressed, the strength of connection between the point C and the loading point A can be discussed. Using the flexibility matrix $C_{AC}$, some parameters other than this can be defined easily. In this way, with the flexibility matrix $C_{AC}$, the various scalar parameters to express the tendency of the deformation between the points A and B can be generated.

As described above, in the second embodiment of this invention, the numerical structure-analysis calculation system is constructed as follows, the load transfer path under the distributed load can be calculated in a practical calculation time. The complementary strain energy U is calculated with the load $p_A$ at the loading point A without fixing the point in the structure. The flexibility matrix $C_{AC}$ is calculated with respect to the loading point A and one point C in the structure. The inverse matrix $C_{CC}^{-1}$ and the flexibility matrix $C_{AC}$ with respect to one point C in the structure is calculated. The value of the parameter $U^{**}=(p_A \cdot C_{AC} C_{CC}^{-1} C_{CA} p_A/(2U))$ at each point C is calculated from the values of $C_{AC}$, $C_{CC}^{-1}$, $p_A$ and U.

EMBODIMENT 3

The third embodiment of this invention is the numerical structure-analysis calculation system as follows. The displacement at each point is calculated with applying the load $p_A$ to the loading point A. The inverse matrix $C_{CC}^{-1}$ of the flexibility matrix $C_{CC}$ with respect to one point in the structure is calculated. The value of the parameter U** at the point C is obtained according to $(d_C \cdot C_{CC}^{-1} d_C)/(2U)$.

FIG. 4 is the conceptual drawing of the numerical structure-analysis calculation system in the third embodiment of this invention and the flowchart of the processing sequence. In FIG. 4, shaping and elastic data 1 is the data about the shape and elasticity of the objective structure for analysis. An FEM calculation means 2 is the means to calculate the deformation of the objective structure for analysis by way of the finite element method. Total stiffness matrix holding means 6 is the means to hold the total stiffness matrix calculated with the FEM calculation means. The load setting means 7 is the means to set the calculation parameters in order to apply the load $p_A$ to the loading point A. The displacement holding means 8 is the means to hold the displacement of each point calculated with the FEM calculation means. The flexibility matrix calculation means 9 is the means to calculate the flexibility matrix $C_{AC}$ and so on.

The operation of the structural analysis numerical calculation system of the third embodiment of this invention as structured above is explained. Applying the load $p_A$ to the loading point A, the displacement at each point is calculated. The displacements of $d_A$ and $d_C$ etc at all the points are obtained. The inverse matrix $C_{CC}^{-1}$ of the flexibility matrix $C_{CC}$ with respect to one point C in the structure is calculated. If the matrix $C_{CC}$ cannot obtained directly, as the displacement of the point C when the load $p_C$ is applied only to the point C is $d_C=C_{CC}p_C$, it can be obtained in the way that the value of $d_C$ is calculated giving the values (1,0,0), (0,1,0), (0,0,1) to the loading vector $p_C$. The value of the parameter U** is calculated according to $(d_C \cdot C_{CC}^{-1} d_C)/(2U)$. The derivation of this is as follows.

$$2U = p_A \cdot d_A$$

$$2U' = p_A \cdot d_A'$$

$$d_A = C_{AA} p_A$$

$$d_C = C_{CA} p_A$$

$$d_A' = C_{AA} p_A + C_{AC} p_C' = d_A + C_{AC} p_C'$$

$$d_C' = C_{CA} p_A + C_{CC} p_C' = 0$$

$$p_C' = -C_{CC}^{-1} C_{CA} p_A$$

$$2U' = p_A \cdot d_A' = p_A \cdot (C_{AA} p_A + C_{AC} p_C')$$

$$= p_A \cdot C_{AA} p_A + p_A \cdot C_{AC} p_C'$$

$$= p_A \cdot C_{AA} p_A + p_A \cdot C_{AC} (-C_{CC}^{-1} C_{CA} p_A)$$

$$= p_A \cdot d_A - p_A \cdot C_{AC} C_{CC}^{-1} C_{CA} p_A$$

$$= 2U - (C_{AC}^T p_A) \cdot C_{CC}^{-1} C_{CA} p_A$$

$$= 2U - (C_{CA} p_A) \cdot C_{CC}^{-1} C_{CA} p_A$$

$$= 2U - d_C \cdot C_{CC}^{-1} d_C$$

$$U^{**} = (U-U')/U = d_C \cdot C_{CC}^{-1} d_C/(2U)$$

Referring to FIG. 4, the processing sequence is explained. Data 1 with respect to the shape and elasticity of the objective structure for analysis is previously given to the FEM calculation means 2. In the step 21, fixing the supporting point B, applying the load $p_A$ to the point A, with the FEM calculation means 2, the displacement is calculated. The displacement is held in the displacement holding means 8. The total stiffness matrix is held with the total stiffness matrix holding means 6.

The necessary energy U at that time is calculated. In the step 22, with the load setting means 7, applying three inspection loadings to the point C, according to its displacement, with the flexibility matrix calculation means 9, the inverse matrix $C_{CC}^{-1}$ of the flexibility matrix $C_{CC}$ is calculated. In the step 23, from U, $d_C$ and $C_{CC}^{-1}$, with the parameter calculation means 5, the parameter U** is calculated. In the step 24, varying sequentially the position of the point C, this calculation is repeated.

As described above, in the third embodiment of this invention, the numerical structure-analysis calculation system is constructed as follows, the load transfer path under the distributed load can be calculated in a practical calculation time. The displacement at each point is calculated with applying the load $p_A$ to the loading point A. The inverse matrix $C_{CC}^{-1}$ of the flexibility matrix $C_{CC}$ with respect to one point in the structure is calculated. The value of the parameter U** at the point C is obtained according to $(d_C \cdot C_{CC}^{-1} d_C)/(2U)$.

EMBODIMENT 4

The fourth embodiment of this invention is the numerical structure-analysis calculation system as follows. The displacement $d_i$ at each point i is calculated with applying the load $p_i$ to each point i. The inverse matrix $C_{CC}^{-1}$ of the flexibility matrix $C_{CC}$ with respect to one point C in the structure is calculated. The value of the parameter U** at the point C is obtained according to $(d_C \cdot C_{CC}^{-1} d_C)/(2U)$.

FIG. 5 is the conceptual drawing of the numerical structure-analysis calculation system in the fourth embodiment of this invention and the flowchart of the processing sequence. In FIG. 5, shaping and elastic data 1 is the data about the shape and elasticity of the objective structure for analysis. An FEM calculation means 2 is the means to calculate the deformation of the objective structure for analysis by the finite element method. Total stiffness matrix holding means 6 is the means to hold the total stiffness matrix calculated with the FEM calculation means. The load setting means 7 is the means to set the calculation parameters in order to apply the distributed load and so on. The displacement holding means 8 is the means to hold the displacement of each point calculated with the FEM calculation means. The flexibility matrix calculation means 9 is the means to calculate the flexibility matrix $C_{CC}$.

The operation of the numerical structure-analysis calculation system of the fourth embodiment of this invention as structured above is explained. Applying the load $p_i$ to all the points, the displacement at each point is calculated. The displacements at all the points including $d_C$ are obtained. The inverse matrix $C_{CC}^{-1}$ of the flexibility matrix $C_{CC}$ with respect to one point C in the structure is calculated. The value of the parameter U** at the point C is calculated according to $(d_C \cdot C_{CC}^{-1} d_C)/(\Sigma_i p_i \cdot d_i)$. The derivation of this is as follows. Here, it is expressed including the case of loading at the point C. The original load at the point C and the reverse load are merged to denote as $p_C'$.

$2U = \Sigma_i p_i \cdot d_i$ $2U' = \Sigma_i p_i \cdot d_i'$ $d_i = \Sigma_j C_{ij} p_j$ $d_i' = \Sigma_j C_{ij} p_j' = d_i - C_{iC}(p_C - p_C')$ $d_i - d_i' = \Sigma_j C_{ij}(p_j - p_j') = C_{iC}(p_C - p_C')$ $d_C - d_C' = C_{CC}(p_C - p_C')$ (in case of $i = C$ as above)

$d_C' = 0$ $2U' = \Sigma_i p_i \cdot d_i' = \Sigma_i p_i \cdot (d_i - C_{iC}(p_C - p_C'))$ $= \Sigma_i p_i \cdot d_i - \Sigma_i p_i \cdot C_{iC}(p_C - p_C')$ $= 2U - \Sigma_i (C_{iC}^T p_i) \cdot C_{CC}^{-1} d_C$ $= 2U - (\Sigma_i C_{Ci} p_i) \cdot C_{CC}^{-1} d_C$ $= 2U - d_C \cdot (C_{CC}^{-1} d_C)$ $U = (U - U')/U = d_C \cdot (C_{CC}^{-1} d_C)/(\Sigma_i p_i \cdot d_i)$ Referring to FIG. 5, the processing sequence is explained. Data 1 with respect to the shape and elasticity of the objective structure for analysis is previously given to the FEM calculation means 2. In the step 31, fixing the supporting point, applying the distributed load, with the FEM calculation means 2, the displacement is calculated. The displacement is held in the displacement holding means 8. The total stiffness matrix is held with the total stiffness matrix holding means 6. The necessary energy U at that time is calculated. In the step 32, applying three inspection loadings to the point C, according to its displacement, with the flexibility matrix calculation means 9, the inverse matrix $C_{CC}^{-1}$ of the flexibility matrix $C_{CC}$ is calculated. In the step 33, from U, $d_C$ and $C_{CC}^{-1}$, with the parameter calculation means 5, the parameter U is calculated. In the step 34, varying sequentially the position of the point C, this calculation is repeated.

The parameter U is the parameter to express the quantity of the deformation energy at the point C. It also expresses the distribution of the strength of the relationship with the distributed load. The parameter U is also the function of the distributed load. Therefore, the distribution of the parameter U varies according to the application of the distributed load. When the change of the distribution of the parameter U according to the change of the distributed load is required to examine, the calculation is needed to be performed with varying the distributed load. When the different distributed load is applied to the same objective structure for analysis, using the memory data of the inverse matrix $C_{CC}^{-1}$ of the flexibility matrix obtained at the first calculation, the calculation can be performed very fast. In the calculation of the second henceforth, calculating the displacement with the new distributed load, the value of U is calculated. The parameter U is calculated from $d_C$ and $C_{CC}^{-1}$. Varying the position of the point C sequentially, this calculation is repeated. The change of the distribution of the parameter U according to the change of the distributed load can be investigated only by repeating easy matrix calculation N (number of points) times.

As described above, in the fourth embodiment of this invention, the numerical structure-analysis calculation system is constructed as follows, the load transfer path under the distributed load can be calculated in a practical calculation time. The displacement $d_i$ at each point i is calculated with applying the load $p_i$ to each point i. The inverse matrix $C_{CC}^{-1}$ of the flexibility matrix $C_{CC}$ with respect to one point C in the structure is calculated. The value of the parameter U** at the point C is obtained according to $(d_C \cdot C_{CC}^{-1} d_C)/(2U)$.

INDUSTRIAL APPLICATION

The numerical structure-analysis calculation system of this invention is most suitable for the numerical calculation system to design the structure by the load-transfer-path method with FEM such as the structural design of automobile and motorcycle or the strength design of buildings.

BRIEF DESCRIPTION OF THE DRAWINGS

FIG. 3 It is the drawing to show the example of calculation of the structural analysis numerical calculation system of the second embodiment of this invention.

REFERENCE SYMBOLS

Figure 1A:
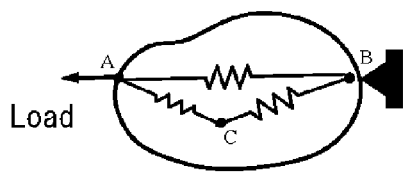
FIG. 1 It is the conceptual drawing and the flowchart of processing of the structural analysis numerical calculation system of the first embodiment of this invention.
Figure 1B:
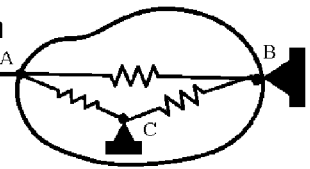
Figure 1C:
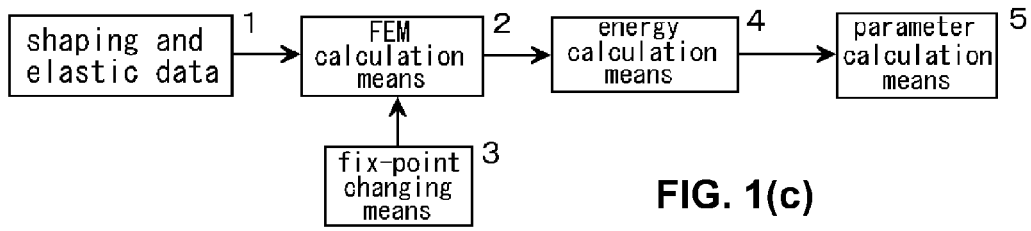
Figure 1D:
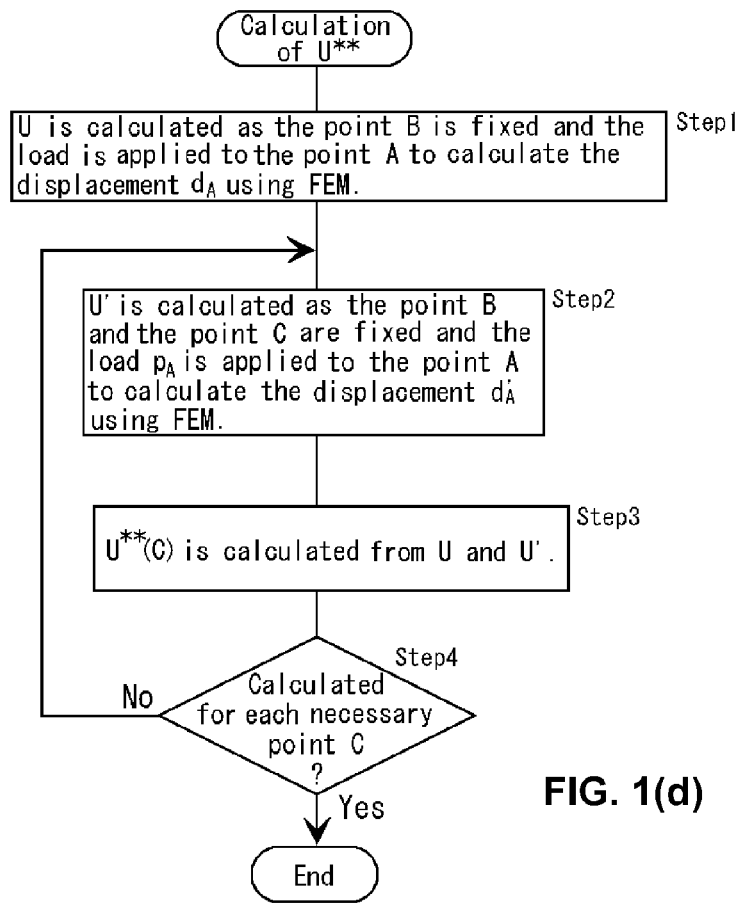
Figure 2A:
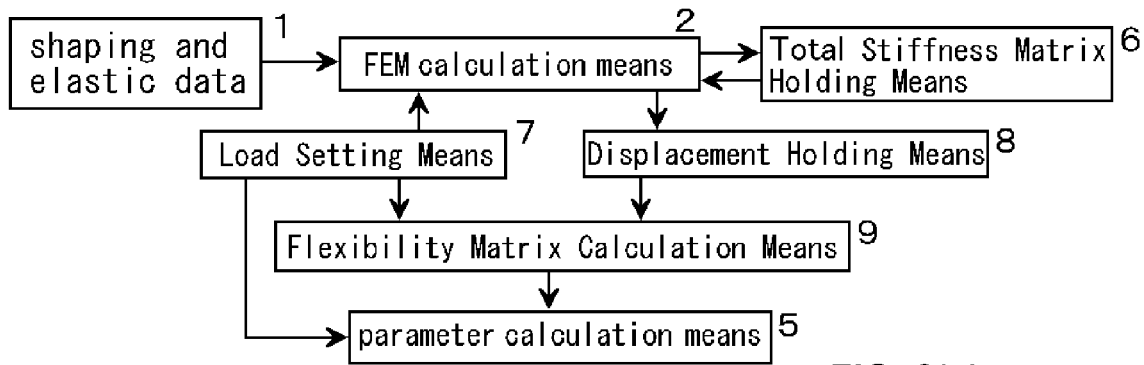
FIG. 2 It is the conceptual drawing and the flowchart of processing of the structural analysis numerical calculation system of the second embodiment of this invention.
Figure 2B:
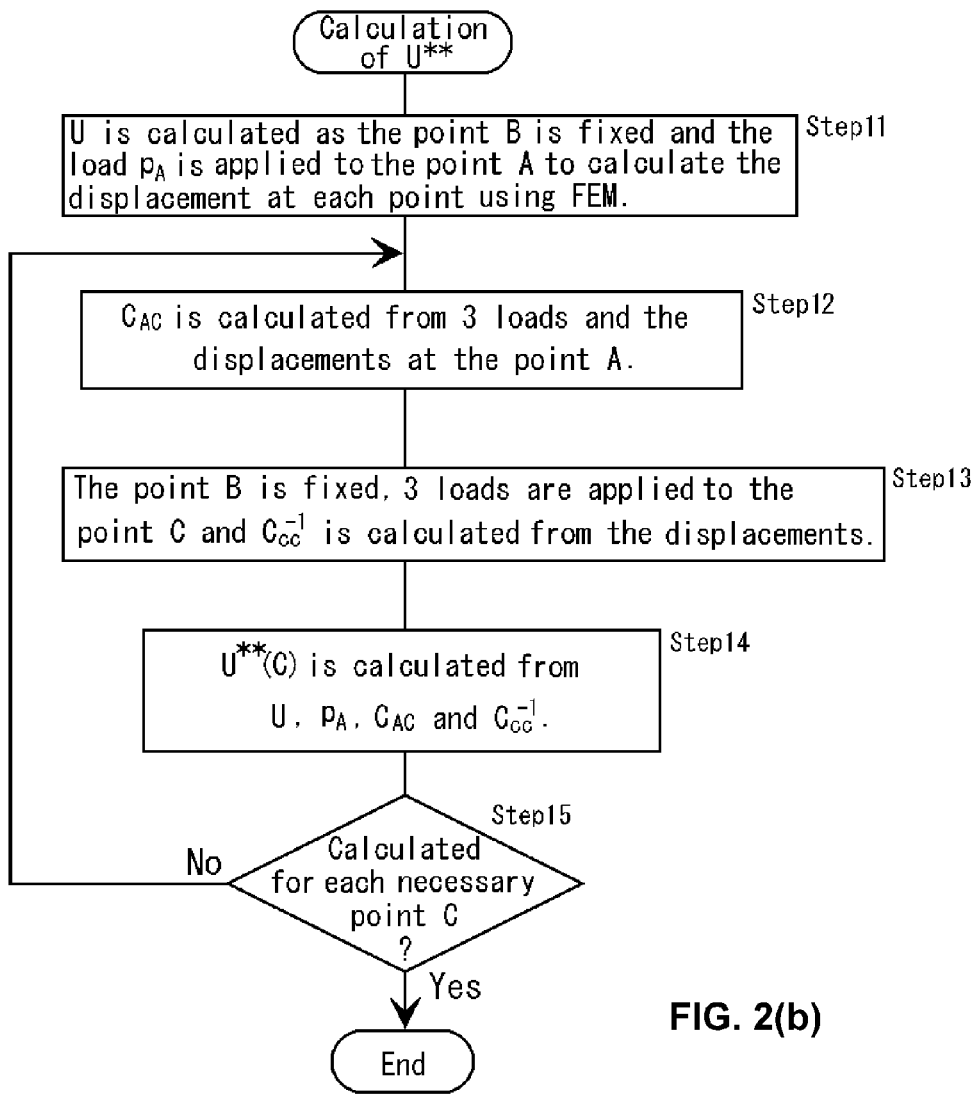
Figure 4A:
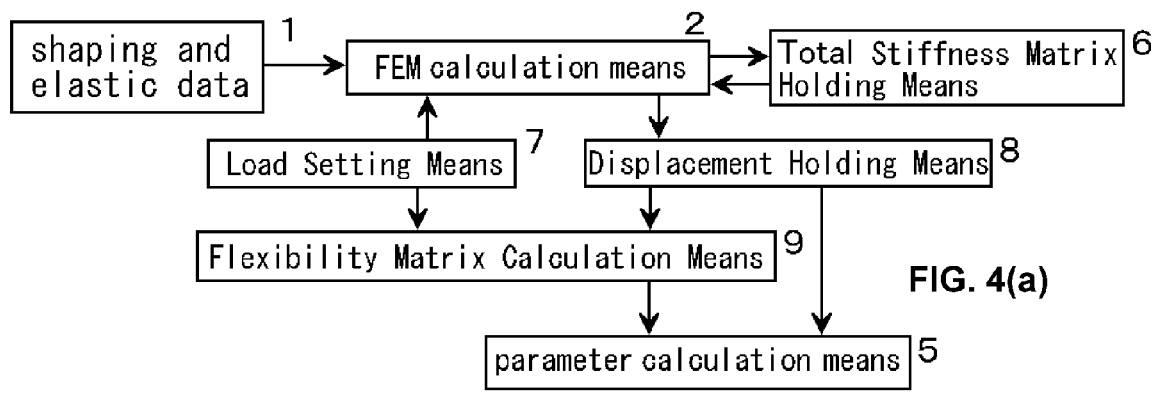
FIG. 4 It is the conceptual drawing and the flowchart of processing of the structural analysis numerical calculation system of the third embodiment of this invention.
Figure 4B:
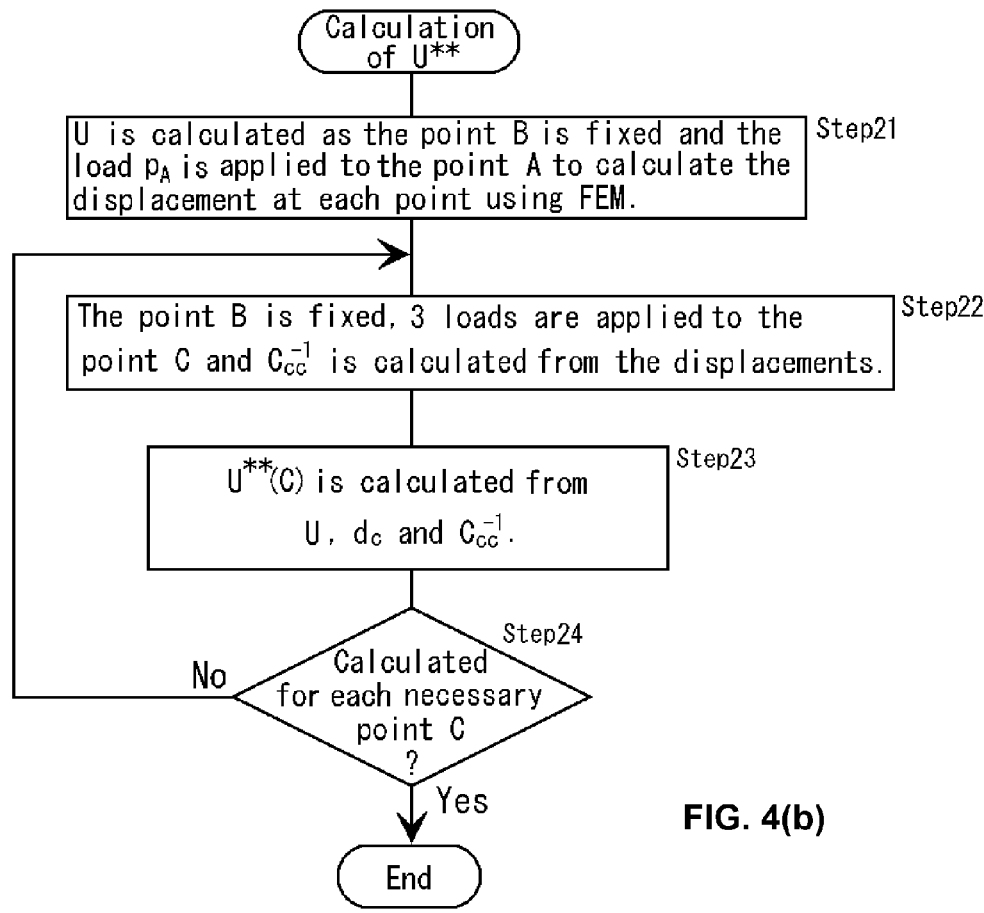
Figure 5A:
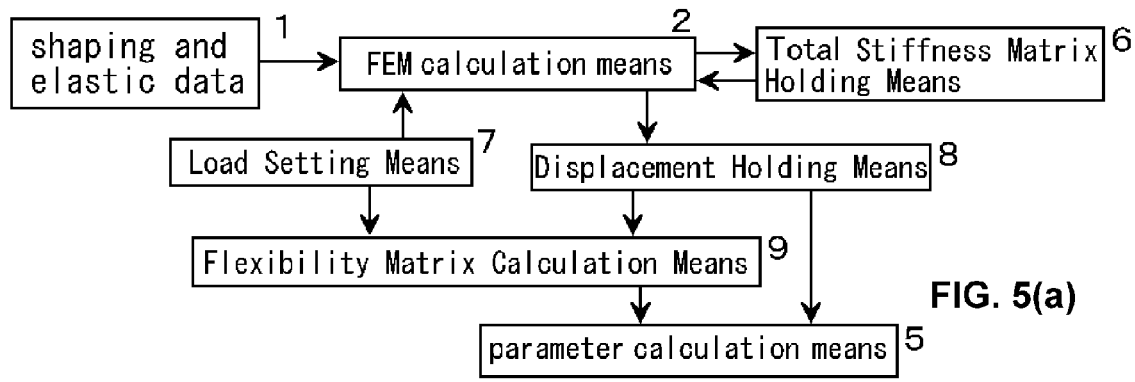
FIG. 5 It is the conceptual drawing and the flowchart of processing of the structural analysis numerical calculation system of the fourth embodiment of this invention.
Figure 5B:
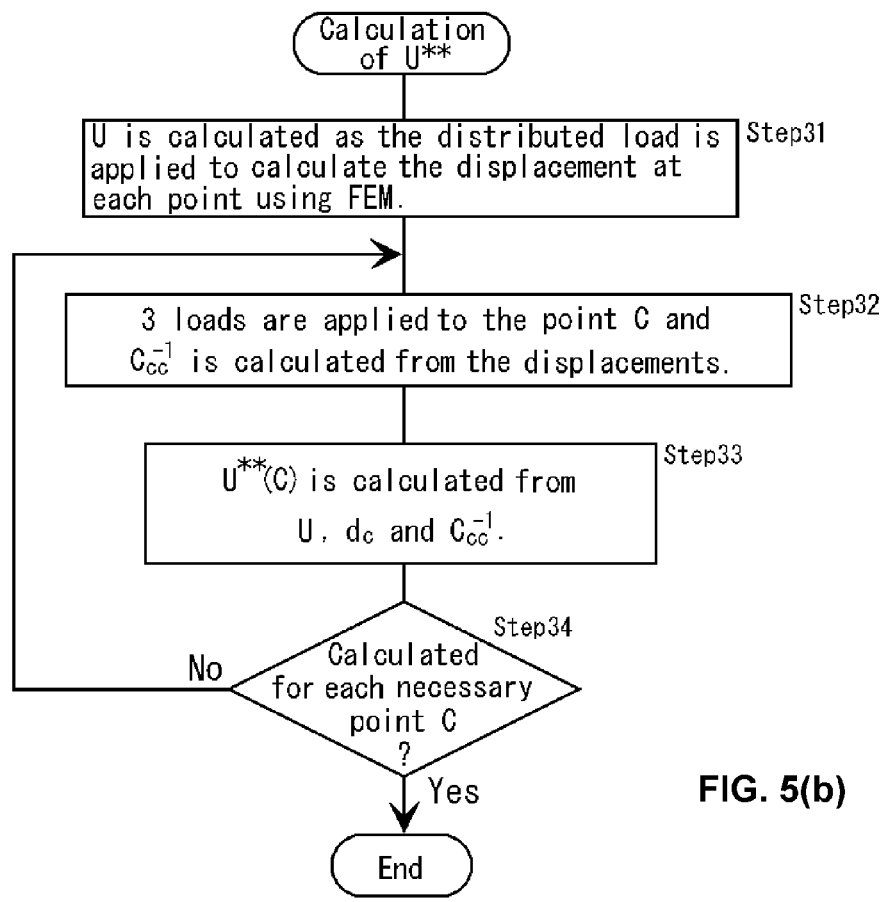

1 Shaping and Elastic Data
2 Finite Element Method Calculation Means
3 Fix-point Changing Means
4 Energy Calculation Means
5 Parameter Calculation Means
6 Total Stiffness Matrix Holding Means
7 Load Setting Means
8 Displacement Holding Means
9 Flexibility Matrix Calculation Means

The invention claimed is:

1. A numerical structure-analysis calculation system to perform structural analysis in one or more processors of objective structure for analysis based on the load-transfer-path method furnished with an FEM calculation means to calculate deformation of objective structure for analysis comprising;
a first calculation means to calculate in the one or more processors the complementary strain energy U under the condition that a loading point is loaded without fixing any points in the structure except for a fixed point B,
a second calculation means to calculate in the one or more processors the complementary strain energy U' under the condition that the loading point is loaded with fixing the one fixed point B and an arbitrary point C in the structure, and
a third calculation means to calculate in the one or more processors the value $U^{**}=(1-(U'/U))$ according to said each complementary strain energy value at each point.

2. A numerical structure-analysis calculation system to perform structural analysis in one or more processors of objective structure for analysis based on the load-transfer-path method with an FEM calculation means to calculate deformation of objective structure for analysis comprising;
a first calculation means to calculate in the one or more processors the complementary strain energy U under the condition that a loading point A is loaded with load $p_A$ without fixing any points in the structure except for the fixed spot B,
a second calculation means to calculate in the one or more processors the flexibility matrix $C_{AC}$ in accordance with both of the loading point A and one point C in the structure,
a third calculation means to calculate in the one or more processors the inverse matrix $C_{CC}^{-1}$ of the flexibility matrix $C_{CC}$ in accordance with one point C in the structure, and
a fourth calculation means to calculate in the one or more processors the value of the parameter $U^{**}=(p_A \cdot C_{AC} C_{CC}^{-1} C_{CA} p_A/(2U))$ at each point C from the values of $C_{AC}$, and $C_{CC}^{-1}$, and $p_A$, and U.

3. The numerical structure-analysis calculation system described in claim 2, wherein a fifth calculation means to calculate the flexibility matrices $C_{AC}$ and $C_{CC}$ according to the inspection loadings in three directions applied to the point C is furnished.

4. A numerical structure-analysis calculation system to perform structural analysis in one or more processors of objective structure for analysis based on the load-transfer-path method with an FEM calculation means to calculate deformation of objective structure for analysis comprising;
a first calculation means to calculate in the one or more processors the complementary strain energy U under the condition that a loading point is loaded with load $p_A$ without fixing any points in the structure,
a memory means to hold the value of the displacement of each point under the condition that the loading point is loaded with $p_A$ without fixing any points in the structure except for the fixed spot B,
a second calculation means to calculate in the one or more processors the inverse matrix $C_{CC}^{-1}$ of the flexibility matrix $C_{CC}$ in accordance with one point C in the structure, and
a third calculation means to calculate in the one or more processors the value of the parameter $U^{**}=(d_C \cdot C_{CC}^{-1} d_C/(2U))$ at each point C from the values of the displacement $d_C$ at point C, and the inverse matrix $C_{CC}^{-1}$, and U.

5. A numerical structure-analysis calculation system to perform structural analysis in one or more processors of objective structure for analysis based on the load-transfer-path method with an FEM calculation means to calculate deformation of objective structure for analysis comprising;
a first calculation means to calculate in the one or more processors the complementary strain energy U under the condition that the distributed load is applied without fixing any points in the structure except for the fixed spot B,
a memory means to hold the value of the displacement of each point under the condition that the distributed load is applied without fixing any points in the structure,
a second calculation means to calculate in the one or more processors the inverse matrix $C_{CC}^{-1}$ of the flexibility matrix $C_{CC}$ in accordance with one point C in the structure, and
a third calculation means to calculate in the one or more processors the value of the parameter $U^{**}=(d_C \cdot C_{CC}^{-1} d_C/(2U))$ at each point C from the values of the displacement $d_C$ at the point C, and the inverse matrix $C_{CC}^{-1}$, and U.

6. A numerical structure-analysis calculation method to perform structural analysis in one or more processors of objective structure for analysis based on the load-transfer-path method with FEM to calculate deformation of objective structure for analysis, characterized by calculating in the one or more processors the complementary strain energy U under the condition that the loading point is loaded without fixing any points in the structure, calculating in the one or more processors the complementary strain energy U' under the condition that the loading point is loaded with fixing one point in the structure, and calculating in the one or more processors the value $U^{**}=(1-(U'/U))$ according to said each complementary strain energy values at each point.

7. A numerical structure-analysis calculation method to perform structural analysis in one or more processors of objective structure for analysis based on the load-transfer-path method with FEM to calculate deformation of objective structure for analysis, characterized by calculating in the one or more processors the complementary strain energy U under the condition that the loading point A is loaded with load $p_A$ without fixing any points in the structure except for the fixed spot B, calculating in the one or more processors the flexibility matrix $C_{AC}$ in accordance with both of the loading point A and one point C in the structure, calculating in the one or more processors the inverse matrix $C_{CC}^{-1}$ of the flexibility matrix $C_{CC}$ in accordance with one point C in the structure, and calculating in the one or more processors the value of the parameter $U^{**}=(p_A \cdot C_{AC} C_{CC}^{-1} C_{CA} p_A/(2U))$ at each point C from the values of $C_{AC}$, $C_{CC}^{-1}$, $p_A$ and U.

8. The numerical structure-analysis calculation method described in claim 7, characterized by calculating the flexibility matrices $C_{AC}$ and $C_{CC}$ according to the inspection loadings in three directions applied to the point C.

9. A numerical structure-analysis calculation method to perform structural analysis in one or more processors of objective structure for analysis based on the load-transfer-path method with FEM to calculate deformation of objective structure for analysis, characterized by calculating in the one or more processors the complementary strain energy U under the condition that the loading point is loaded with load $p_A$ without fixing any points in the structure except for the fixed spot B, holding the value of the displacement of each point under the condition that the loading point is loaded with $p_A$ without fixing any points in the structure, calculating in the one or more processors the inverse matrix $C_{CC}^{-1}$ of the flexibility matrix $C_{CC}$ in accordance with one point C in the structure, calculating in the one or more processors the value of the parameter $U^{**}=(d_C \cdot C_{CC}^{-1} d_C/(2U))$ at each point C from the values of the displacement $d_C$ at point C, the inverse matrix $C_{CC}^{-1}$ and U.

10. A numerical structure-analysis calculation method to perform structural analysis in one or more processors of objective structure for analysis based on the load-transfer-path method with FEM to calculate deformation of objective structure for analysis, characterized by calculating in the one or more processors the complementary strain energy U under the condition that the distributed load is applied without fixing any points in the structure except for the fixed spot B, holding the value of the displacement of each point under the condition that the distributed load is applied without fixing any points in the structure, calculating in the one or more processors the inverse matrix $C_{CC}^{-1}$ of the flexibility matrix $C_{CC}$ in accordance with one point C in the structure, and calculating in the one or more processors the value of the parameter $U^{**}=(d_C \cdot C_{CC}^{-1} d_C/(2U))$ at each point C from the values of the displacement $d_C$ at point C, the inverse matrix $C_{CC}^{-1}$ and U.

11. A computer program product comprising a non-transitory recording media wherein are described the processing sequences to perform the numerical structure-analysis calculation method described in claim 10 with a computer.

12. A computer program product comprising a non-transitory recording media wherein are described the processing sequences to perform the numerical structure-analysis calculation method described in claim 6 with a computer.

13. A computer program product comprising a non-transitory recording media wherein are described the processing sequences to perform the numerical structure-analysis calculation method described in claim 7 with a computer.

14. A computer program product comprising a non-transitory recording media wherein are described the processing sequences to perform the numerical structure-analysis calculation method described in claim 8 with a computer.

15. A computer program product comprising a non-transitory recording media wherein are described the processing sequences to perform the numerical structure-analysis calculation method described in claim 9 with a computer.

* * * * *